United States Patent [19]

Urayama

[11] Patent Number: 5,401,673
[45] Date of Patent: Mar. 28, 1995

[54] PROCESS FOR THE FORMATION OF CONTACT HOLES IN SEMICONDUCTOR INTEGRATED CIRCUIT

[75] Inventor: Takehiro Urayama, Kawasaki, Japan

[73] Assignee: Fujitsu Limited, Kawasaki, Japan

[21] Appl. No.: 110,933

[22] Filed: Aug. 24, 1993

[30] Foreign Application Priority Data

Sep. 2, 1992 [JP] Japan .................................. 4-234542

[51] Int. Cl.$^6$ ............................................ H01L 21/44
[52] U.S. Cl. ..................................... 437/187; 437/233
[58] Field of Search ....................... 437/187, 191, 233; 148/DIG. 51, DIG. 106, DIG. 118

[56] References Cited

U.S. PATENT DOCUMENTS

| 4,341,009 | 7/1982 | Barthalomew et al. | 437/191 |
| 5,037,772 | 8/1991 | McDonald | 437/191 |
| 5,179,031 | 1/1993 | Brassington et al. | 437/233 |

FOREIGN PATENT DOCUMENTS 63-196064  8/1988  Japan .

*Primary Examiner*—Olik Chaudhuri
*Assistant Examiner*—C. Everhart
*Attorney, Agent, or Firm*—Staas & Halsey

[57] ABSTRACT

A first conductive film which is formed on both an insulating film and a field insulating film is covered by a buffer insulating film. After that, an opening is formed through from a region on the semiconductor substrate to a region on the field insulating film by patterning the insulating film, the first conductive film and the buffer insulating film. Then, the surface of the semiconductor substrate in the opening is processed by using vapor-etching method. Lastly, the second conductive film connected to the semiconductor substrate in the opening is formed. When vapor-etching, the buffer insulating film remains around the opening, so that a etchant is supplied uniformly. Thereby, excessive etching is restrained, then the field insulating film with sufficient thickness remains in the opening. Also, the natural oxide in the opening has been exposed to the etchant from the first stage of etching, so that the natural oxide is securely etched and removed.

2 Claims, 5 Drawing Sheets hydrofluoric acid anhydride

PROCESS FOR THE FORMATION OF CONTACT HOLES IN SEMICONDUCTOR INTEGRATED CIRCUIT

BACKGROUND OF THE INVENTION

1. Field of the Invention

The present invention relates to a method for the formation of contact holes in the semiconductor integrated circuit, and more particularly, to a method for the formation of contact holes in the semiconductor integrated circuit, in which contact holes are formed through from the region on the source/drain region (hereinafter called "S/D region") to the region on the field insulating film adjacent to the S/D region, then through those contact holes the interconnection layer is connected to the S/D region.

2. Description of Prior Art

In the semiconductor integrated circuit, particularly in the SRAM (Static Random Access Memory), the insulated gate field effect transistors which are formed on both sides of the field insulating film of isolation region are connected by interconnection. For such connection, the contact holes are formed on the S/D regions of transistors. However, in case of making the S/D regions and the contact holes fine to advance the integration level, it becomes difficult to secure a sufficient area of the contact hole. In such a case, to secure the sufficient area, the contact hole is formed through from the region on the S/D region to the region on the field insulating film adjacent to the S/D region.

In order to contact the S/D region and the interconnection layer each other securely, the natural oxide on the surface of S/D region in the contact hole must be removed before the interconnection layer is formed. As its process, for example, there is a method called "vapor etching" using gaseous etchant. In such a process, outside the region where the contact hole is formed, the insulating film must remain to hold the insulation between the semiconductor substrate and the interconnection layer, but while vapor-etching such insulating film is exposed to the etchant, so there is a risk that the insulating film is damaged. To prevent such damage, for example, as illustrated in a patent document of the Japanese unexamined publication (KOKAI) 63-196064, a protecting film is formed on the insulating film except the region where the contact hole is formed.

When the above technique in the patent document of the Japanese unexamined publication (KOKAI) 63-196064 is applied to the case where the field insulating film appears in the contact hole, the insulating film is protected by the protecting film while the natural oxide is etched. However, the field insulating film exposed in the contact hole is etched excessively, so that the field insulating film itself might become thin, or the semiconductor substrate under the field insulating film might come out. In this case, when the interconnection layer is formed in the contact hole, there come some problems that the semiconductor substrate under the field insulating film might be inverted, or the S/D regions of the transistors on both sides of the field insulating layer might short. To prevent such short-circuit, it might be considered to adjust the etching rate. However, since the etching rate of the substance to be etched in the contact hole depends on the opening area of contact hole, it is not possible to obtain the etching rate to be uniform throughout the semiconductor substrate.

SUMMARY OF THE INVENTION

An object of the present invention is to provide a method for the formation of the contact hole in the semiconductor integrated circuit, in which the field insulating film with sufficient thickness remains in the opening, and a better contact through the opening is obtained between the semiconductor substrate and the interconnection layer, in case of forming the opening to extend through from the region on the semiconductor substrate to the region on the field insulating film, and after pre-processing, forming a interconnection layer in the opening.

When pre-processing by using vapor-etching method, the etchant is liable to be excessively supplied to the region where the substance to be etched exists. Accordingly, it is considered that in the prior art the excessive etching of the field insulating film arises in consequence of excessive supply of the etchant into the contact hole because the substance to be etched exists partly in the contact hole (opening).

In the present invention, the specified opening is formed through a process covering the first conductive film on the insulating film with the buffer insulating film and a process patterning the insulating film, the first conductive film and the buffer insulating film, thereby the buffer insulating film remains on the first conductive film around the opening. Consequently, when etching the natural oxide in the opening by the vapor-etching method, the substance to be etched exists uniformly both in the opening and throughout the wide region around the openings. Accordingly, because the etchant of vapor-etching is properly dispersed, the etching rate of both the natural oxide and field insulating film in each opening is almost fixed without depending on the opening area of individual opening.

For such reason, the excessive etching of the field insulating film in the opening is restrained, and the field insulating film with sufficient thickness remains. Accordingly, when the second conductive film is formed in the opening, the electric field strength influenced by the second conductive film to the semiconductor substrate is relaxed, so that the semiconductor substrate under the second conductive film is protected from its inverting. Or, because the second conductive film and the semiconductor substrate are insulated each other securely, the transistors on both sides of the field insulating film are protected from their short circuiting.

Moreover, since at the time of vapor-etching the natural oxide has appeared in the opening, the natural oxide in the opening has been exposed to the etchant from the first stage. Accordingly, the natural oxide is securely etched and removed, and thus the semiconductor substrate securely appears. Thereby, a better contact between the second conductive film and the semiconductor substrate is obtained.

Further, when the present invention is applied to the semiconductor integrated circuit having the insulated gate field effect transistors on both sides of the field insulating film, an opening is formed through from the region on the S/D region to the region on the field insulating film, and when the interconnection layer connected to the S/D region in the opening has been formed after pre-processed, the field insulating film with sufficient thickness remains under the interconnection layer. Thereby, the semiconductor substrate underneath the interconnection layer is protected from its inverting, or the S/D regions of the transistors on both sides of the field insulating film are protected from their short circuiting. Further, because the natural oxide on the S/D region in the opening is securely etched and removed, a better contact between the interconnection and the S/D region is obtained.

Figure 1A:
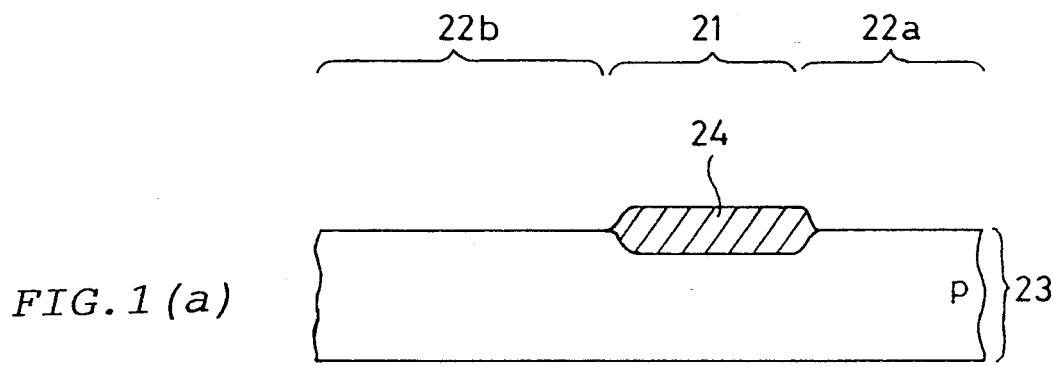
FIG. 1 (a) to FIG. 1 (g) are sectional views illustrating a method for the formation of contact holes in the semiconductor integrated circuit according to an embodiment of the present invention.
Figure 1B:
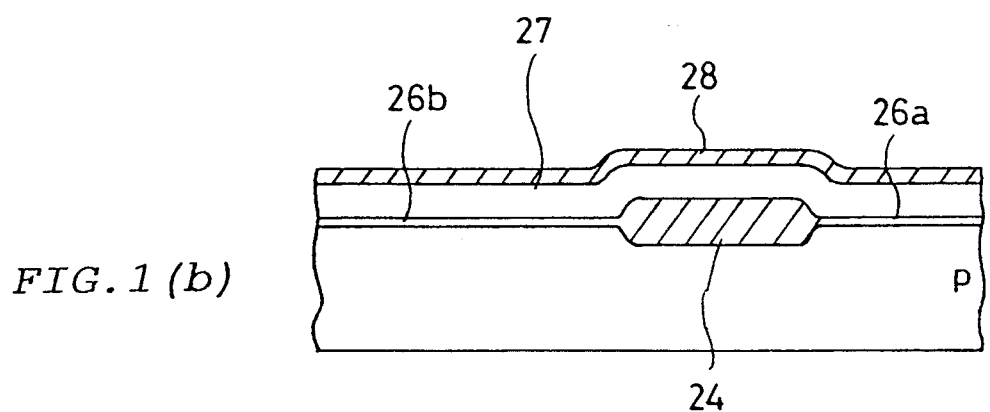
Figure 1C:
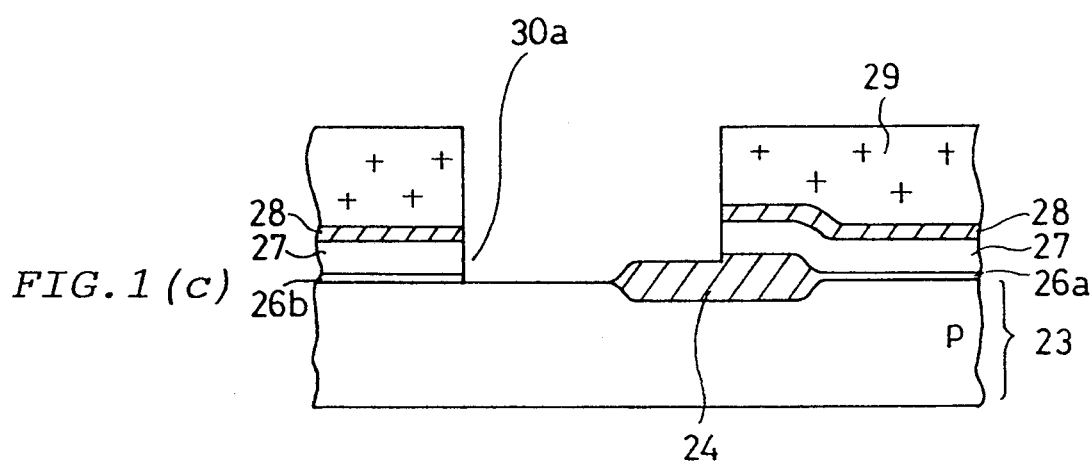
Figure 1D:
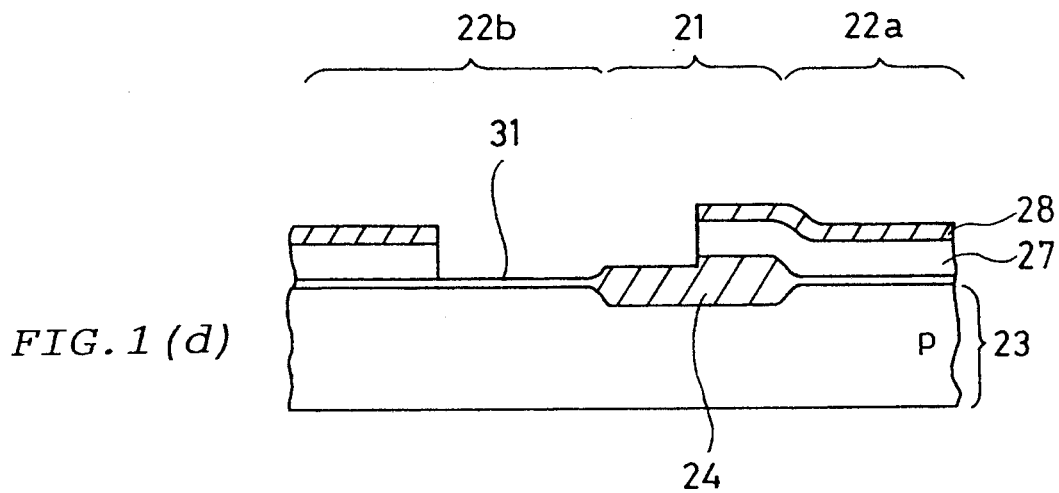
Figure 1E:
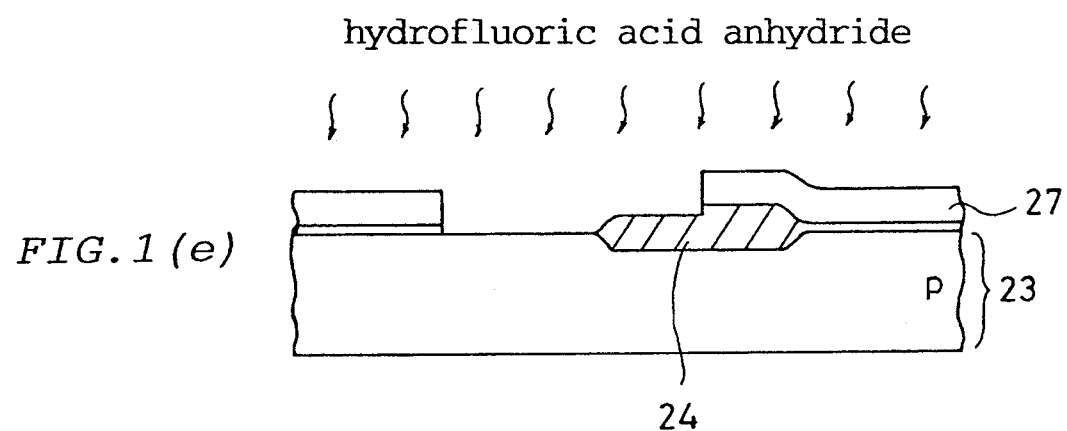
Figure 1F:
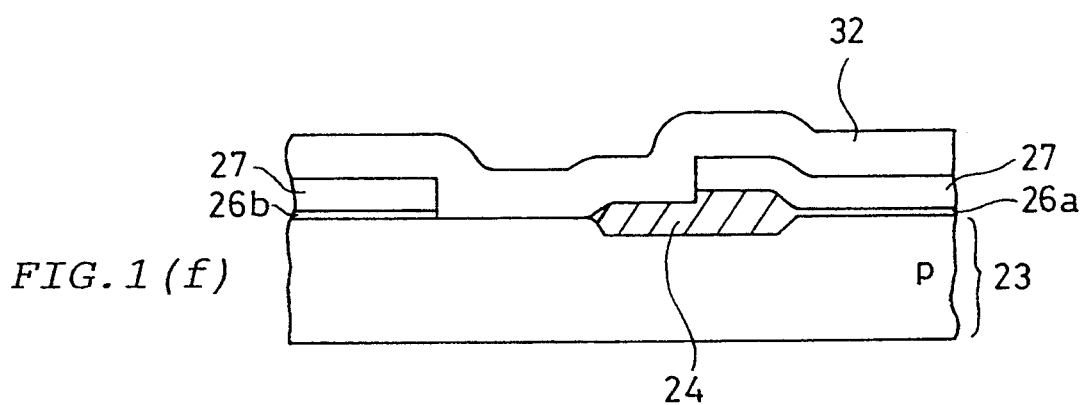
Figure 1G:
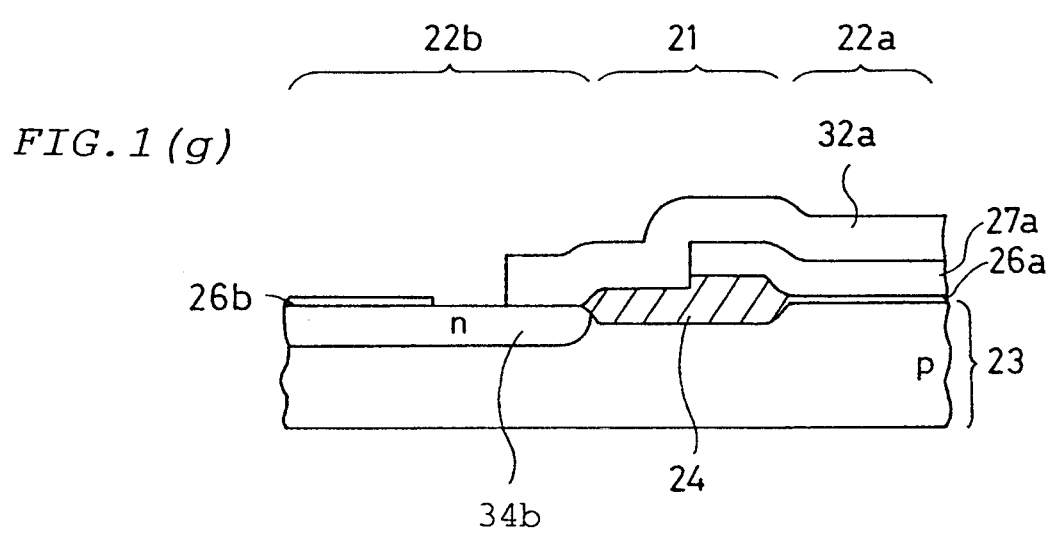
Figure 2A:
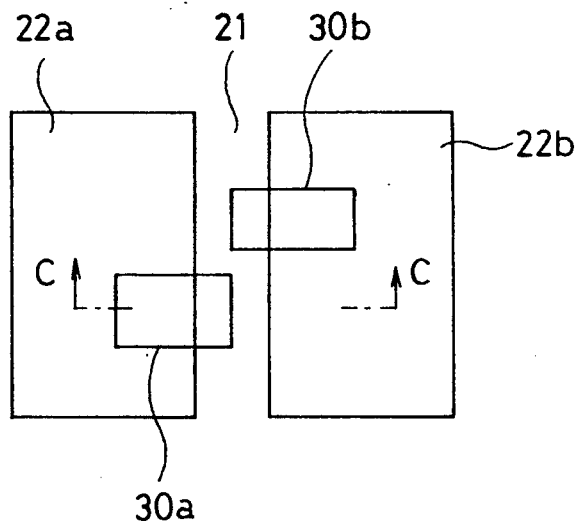
FIG. 2 (a) to FIG. 2 (b) are plan views illustrating a method for the formation of contact holes in the semiconductor integrated circuit according to an embodiment of the present invention.
Figure 2B:
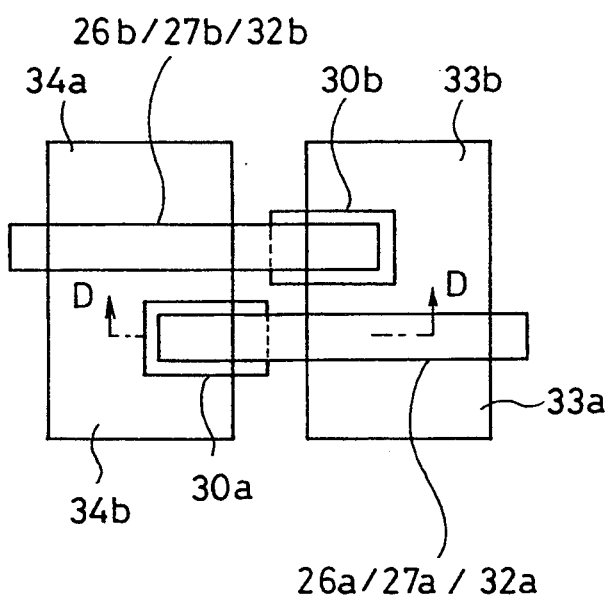

The A—A line sectional view of FIG. 2 (a) is FIG. 1 (c), and the B—B line sectional view of FIG. 2 (b) is FIG. 1 (f).

Figure 3A:
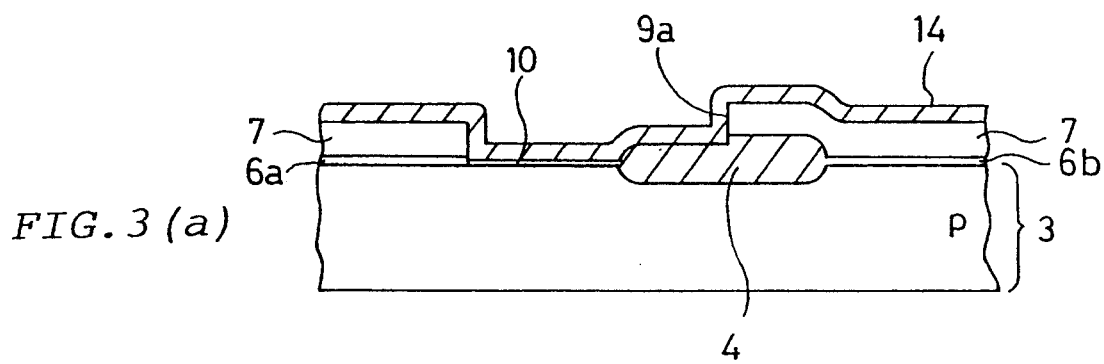
Figure 3B:
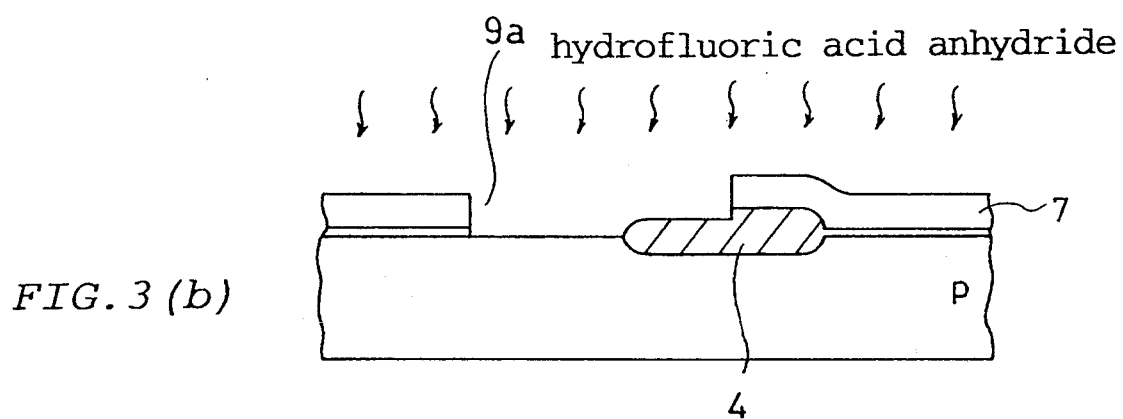
Figure 3C:
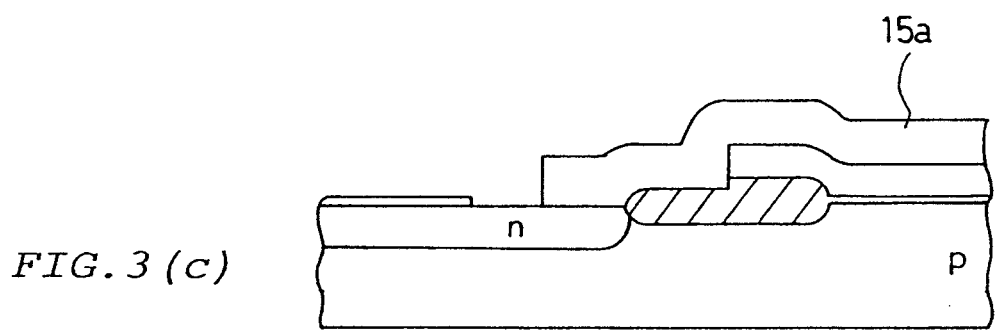

FIG. 3 (a) to FIG. 3 (c) is a sectional view illustrating a method for the formation of the contact hole in the semiconductor integrated circuit according to a comparison example to the present invention.

DESCRIPTION OF THE PREFERRED EMBODIMENT (1) A Method for the Formation of Contact Holes in the Semiconductor Integrated Circuit Firstly, as illustrated in FIG. 1 (a), $SiO_2$ film (field insulating film) 24 with thickness of 4000–5000Å is formed on the surface of p-type Si substrate (semiconductor substrate) 23 by local oxidation. The forming region of said $SiO_2$ film 24 becomes the isolation region 21, and the Si substrate 23 on both sides of the isolation region 21 become the first element forming region 22a and the second element forming region 22b.

Secondly, as illustrated in FIG. 1 (b), $SiO_2$ films (insulating films) 26a and 26b with thickness of 150–250Å are formed on the surface of semiconductor substrate 23 by thermal oxidation. The $SiO_2$ films 26a and 26b become the gate insulated film later.

Further, the first polysilicon film (first conductive film) 27 with thickness 200–1000Å is formed on the $SiO_2$ films 26a and 26b by CVD (chemical vapor deposition) method, and then the $SiO_2$ film 28 with thickness of 300–500Å is formed on the first polysilicon film 27 by thermal oxidation or CVD method. At the time of vapor-etching, the first polysilicon film 27 becomes the protecting layer to protect the $SiO_2$ films 26a and 26b from the etchant, and further are used as the gate electrode. Also at the time of vapor-etching, the $SiO_2$ film 28 on the first polysilicon film 27 becomes the buffer insulating film 28 so that the etchant is supplied uniformly.

Next, as illustrated in FIG. 1 (c), a resist pattern 29 is formed in the region other than that forming the contact hole. Moreover, with the resist pattern 29 as the mask, the buffer insulating film 28, the first polysilicon film 27 and $SiO_2$ films 26a and 26b are etched and removed one after another. Thereby, as illustrated in FIG. 2 (a), the first contact hole (first opening) 30a and the second contact hole (second opening) 30b are formed on both sides of the isolation region 21. At that time, the first contact hole 30a and the second contact hole 30b are formed through from the region on the semiconductor substrate 23 to the region on the field insulating film 24 respectively.

Further, as illustrated in FIG. 1 (d), the resist pattern 29 is removed. After that, the natural oxide film 31 is formed on the surfaces of the silicon substrate 23 in the first contact hole 30a and the second contact hole 30b.

Moreover, as illustrated in FIG. 1 (e), the silicon substrate 23 is exposed to the gaseous hydrofluoric acid anhydride, and the natural oxide film 31 is etched and removed. At that time, since the buffer insulating film 28 is formed on the first polysilicon film 27, the natural oxide 31 and buffer insulating film 28 are etched together. Because the substance to be etched exists throughout the entire silicon substrate 23, the etchant is supplied uniformly throughout the entire surface, and the etching rates of both natural oxide film and field insulating film in all of openings are almost fixed without depending on the area of opening. Thereby, the etching volume of natural oxide film 31 and field insulating film 24 is easily controlled, and the field insulating film 24 is not excessively etched. Also, since the natural oxide film 31 is exposed in the first contact hole 30a and the second contact hole 30b before the pre-processing, the natural oxide film 31 is exposed to the etchant from the first stage of etching. Thereby, the natural oxide film 31 is securely etched and removed, the silicon substrate 23 of the first element forming region 22a securely comes out in the first contact hole 30a, and the silicon substrate 23 of the second element forming region 22b securely comes out in the second contact hole 30b.

Further, as illustrated in FIG. 1 (f), in order to form the interconnection layer, the second polysilicon film 32 with thickness of 1000–2000Å is formed on the whole surface.

Moreover, the first polysilicon film 27 and the second polysilicon film 32 are selectively etched by using the common mask pattern and removed. Thereby, as illustrated in FIG. 2 (b), both the first interconnection layer 32a and the first gate insulated electrode 27a piled under the first interconnection layer 32a are formed, and both the second interconnection layer 32b and the second gate electrode 27b under the second interconnection layer 32b are formed. Then, the first interconnection layer 32a extendedly exists in the S/D region 34b of the second element forming region 22b, and thus the S/D region 34b and the first gate electrode 27a are connected each other, and also the second interconnection layer 32b extendedly exists in the S/D region 33b of the first element forming region 22a, and thus the S/D region 33b and the second gate electrode 27b are connected each other. Further, the $SiO_2$ films 26a and 26b underneath each of the first gate electrode 27a and the second gate electrode 27b become the first gate insulated film 26a and the second gate insulated film 26b respectively.

Further, as illustrated in FIG. 1 (g) and FIG. 2 (b), in the state of being masked by both the first interconnection layer 32a and the second interconnection layer 32b, n-type impurities are ion-implanted, and n-type impurities in the first interconnection layer 32a diffuse into the silicon substrate 23 in the first contact hole 30a, whereas, n-type impurities in the second interconnection layer 32b diffuse into the silicon substrate 23 in the second contact hole 30b. Thereby, the S/D regions 33a and 33b are formed in the silicon substrate 23 of the first element forming region 22a, while the S/D regions 34a and 34b are formed in the silicon substrate 23 of the second element forming region 22b, and thus the insulated gate field effect transistors on both sides of the isolation region are completed. Then, the first gate electrode 27a and the S/D region 34b of transistors of the second element forming region 22b are connected, also the second gate electrode 27b and the S/D region 33b of transistors of the first element forming region 22a are connected. Besides, instead of injecting n-type impurities in the first polysilicon film 32a and the second polysilicon film 32b into the silicon substrate 23 in the first contact hole 30a and the second contact hole 30b, after the contact hole 30a illustrated in FIG. 1 (c) has been formed, n-type impurities may be injected into the silicon substrate 23 by such as the ion implantation through the contact hole 30a.

As stated above, according to an embodiment of the present invention, when removing the natural oxide film 31 by the vapor-etching method, as illustrated in FIG. 1 (d), the buffer insulating film 28 has been formed on the first polysilicon film 27, and thus the natural oxide film 31 and the buffer insulating film 28 are simultaneously etched. Thereby, the etchant is supplied uniformly throughout the entire region, so that the etching rate of the natural oxide film 31 and the field insulating film 24 in the first contact hole 30a is almost fixed without depending on the area of opening. Accordingly, the etching volume is easily controlled, and as illustrated in FIG. 1 (e), the field insulating film 24 is not excessively etched, contrary to the prior processing.

Thereby, in the first contact hole 30a and the second contact hole 30b, the field insulating film 24 with sufficient thickness remains. Consequently, when the first interconnection layer 32a has been formed in the first contact hole 30a, and the second interconnection layer 32b has been formed in the second contact hole 30b, the electric field strength effected to the semiconductor substrate 23 underneath the field insulating film 24 by the first interconnection layer 32a and the second interconnection layer 32b is relaxed, so that the semiconductor substrate 23 underneath the first interconnection layer 32a and the second interconnection layer 32b are protected from their inverting. Or, because each of the first interconnection layer 32a and the second interconnection layer 32b is securely insulated with the semiconductor substrate 23, the S/D regions 33a and 34b, or the S/D regions 33b and 34a on both sides of the field insulating films 24 are protected from their short circuiting each other.

Further, because the natural oxide film 31 has appeared in the first contact hole 30a and the second contact hole 30b before pre-processing, the natural oxide film 31 has been exposed to the etchant from the initial stage of etching. Accordingly, the natural oxide film 31 is securely etched and removed, then the surface of silicon substrate 23 securely appears. Thereby, a good contact is obtained between the first interconnection layer 32a and the S/D region 34b, and similarly between the second interconnection layer 32b and the S/D region 33b.

Moreover, according to the above embodiment of the present invention, the polysilicon films are used as the first conductive film 27 and the second conductive film 32, polycide films with piling silicide films on the polysilicon films can be used.

(2) Comparison Example to the above Embodiment

Further, in comparison of the effects obtained by the above embodiment of the present invention, referring to FIG. 3 (a) through FIG. 3 (c) the comparison example is explained. In this comparison example, it is similar to the above embodiment of the present invention that the etching rates are uniform by forming the buffer insulating film and by dispersing etchant, but it is different from the above embodiment of the present invention that the buffer insulating film is formed after the contact hole has been formed.

Firstly, as illustrated in FIG. 3 (a), the field insulating film is formed on the silicon substrate 3 by local oxidation. After the SiO$_2$ films 6a and 6b has been formed on the silicon substrate by thermal oxidation, the first polysilicon film 7 is formed. Next, by patterning the SiO$_2$ films 6a, 6b and the first polysilicon film 7, the contact hole is formed through from the region on the silicon substrate 3 to the region on the field insulating film 4. By the time of the next processing after the preceding process has been completed, the natural oxide 10 is formed on the surface of silicon substrate 3 in the contact hole 9a.

Secondly, the buffer insulating film 14 is formed wholly, and then covers the contact hole 9a and the first polysilicon film 7. At the same time, the natural oxide 10 is covered by the buffer insulating film 14.

Further, as illustrated in FIG. 3 (b), upon vapor-etching by using hydrofluoric acid anhydride, both the buffer insulating film 14 and the natural oxide 10 in the contact hole 9a is removed. Simultaneously, the buffer insulating film 14 around the contact hole 9a is etched and removed, so that the etchant is properly dispersed. Thereby, the etching rates of the substances to be etched are uniform without depending on the area of openings.

Subsequently, as illustrated in FIG. 3 (c), the interconnection layer is formed in the contact hole 9a.

However, according to the comparison example, the field insulating film 4 in the contact hole 9a is protected from its excessive etching by vapor-etching. At the initial stage of vapor-etching, the natural oxide 10 in the contact hole 9a is covered by buffer insulating film 14, therefore, the natural oxide 10 may remain without being etched sufficiently. However, in case of continuing to etch furthermore in order to remove the natural oxide 10 sufficiently, there is a risk that the field insulating film 4 is excessively etched similar to the prior example.

What is claimed is:

1. A method of forming contact holes in a semiconductor integrated circuit comprising the steps of:
    providing a semiconductor substrate;
    forming a field insulating film of a first thickness on selected areas of a surface of said substrate;
    forming an insulating film of a second thickness thinner than said first thickness on the surface of said semiconductor substrate;
    forming a first conductive film on the upper surface of said insulating film;
    forming a buffer insulating film on the upper surface of said first conductive film;
    patterning the buffer insulating film, the first conductive film, and the insulating film to form an opening to expose a portion of said semiconductor substrate and a portion of said field insulating film;
    etching to remove insulating material remaining on the surface of said semiconductor substrate in said opening and to remove the buffer insulating film on the first conductive film thereby exposing the surface of the semiconductor substrate in the opening and the surface of said first conductive film; and forming a second conductive film to connect the first conductive film and the semiconductor substrate in the opening by way of the second conductive film.

2. A method of forming contact holes in a semiconductor integrated circuit comprising:

providing a semiconductor substrate;

forming a field insulating film on selected areas of a surface of said semiconductor substrate thereby isolating a first element forming region and a second element forming region;

forming a gate insulating film on the surface of said semiconductor substrate;

forming a first conductive film over said field insulating film and said gate insulating film;

forming a buffer insulating film over said first conductive film;

patterning the buffer insulating film, the first conductive film, and the gate insulating film thereby forming:

a first opening extending from an area on the semiconductor substrate of the second element forming region to an area on the field insulating film, and a second opening extending from an area on the semiconductor substrate of the first element forming region to an area on the field insulating film;

etching to remove insulating material on the semiconductor substrate in the first and second openings along with the buffer insulating film on the first conductive film thereby exposing:

the surface of said semiconductor substrate in the first and second openings, and the surface of the first conductive film;

forming a second conductive film over the area of said semiconductor substrate;

patterning said first and second conductive film thereby forming:

a first gate electrode in the first element forming region, a first interconnection layer to connect the first gate electrode and the semiconductor substrate in the first opening, a second gate electrode in the second element forming region, and a second interconnection layer to connect the second gate electrode and the semiconductor substrate in the second opening; and introducing impurities into the semiconductor substrate to form source/drain regions in the semiconductor substrate on both sides of the first gate electrode and on both sides of the second gate electrode.

* * * * *